(12) United States Patent
Hwang et al.

(10) Patent No.: US 8,922,122 B2
(45) Date of Patent: Dec. 30, 2014

(54) ION IMPLANTATION WITH CHARGE AND DIRECTION CONTROL

(75) Inventors: Chih-Hong Hwang, New Taipei (TW); Chun-Lin Chang, Jhubei (TW); Nai-Han Cheng, Hsinchu County (TW); Chi-Ming Yang, Hsinchu (TW); Chin-Hsiang Lin, Hsin-Chu (TW)

(73) Assignee: Taiwan Semiconductor Manufaturing Company, Ltd., Hsin-Chu (TW)

( * ) Notice: Subject to any disclaimer, the term of this patent is extended or adjusted under 35 U.S.C. 154(b) by 166 days.

(21) Appl. No.: 13/308,614

(22) Filed: Dec. 1, 2011

(65) Prior Publication Data
US 2013/0140987 A1 Jun. 6, 2013

(51) Int. Cl.
*H01J 7/24* (2006.01)
(52) U.S. Cl.
USPC . 315/111.81; 313/497; 313/495; 315/111.21; 315/111.91; 445/24; 428/213
(58) Field of Classification Search
USPC ............. 315/111.81; 250/425, 423 R, 288; 29/143
See application file for complete search history.

(56) References Cited

U.S. PATENT DOCUMENTS

| | | | | |
|---|---|---|---|---|
| 3,045,140 A | * | 7/1962 | Gleichauf | 313/426 |
| 5,869,169 A | * | 2/1999 | Jones | 428/213 |
| 6,835,111 B2 | * | 12/2004 | Ahn et al. | 445/24 |
| 7,042,148 B2 | * | 5/2006 | Ahn et al. | 313/497 |
| RE40,566 E | * | 11/2008 | Yoshioka et al. | 313/309 |
| 7,590,161 B1 | * | 9/2009 | Hug et al. | 372/74 |
| 7,710,014 B2 | * | 5/2010 | Lee et al. | 313/497 |
| 7,838,842 B2 | * | 11/2010 | Horsky | 250/423 R |
| 7,853,364 B2 | * | 12/2010 | Deakins et al. | 700/289 |

OTHER PUBLICATIONS

Li et al, "Surface conduction electron emission in palladium hydrogenation nano gaps" J..Phys. D Appl Phys 41 (2008) 085301 p. 1-6 I.*
Yimming Li et al "Surface conduction electron emission in palladium hydrogenation nanogaps" IOP Science, 2008 J. APhys. D Appl Phys. 41 (2008) 085301 p. 1-6.*
Tsai C et al, "Nanogap formation by palladium hydrogenation for surface conduction electron emitters fabrication" Appl Phys V Lett. 90 163115-7.*
Lo et al Field emission properties of novel palladium nanogaps for surface conduction electron emitters, IOP, Nanotechnology, W 18 (2007) 4075708 p. 1-7.*

* cited by examiner

*Primary Examiner* — Douglas W Owens
*Assistant Examiner* — Srinivas Sathiraju
(74) *Attorney, Agent, or Firm* — Haynes and Boone, LLP

(57) ABSTRACT

The present disclosure provides for various advantageous methods and apparatus of controlling electron emission. One of the broader forms of the present disclosure involves an electron emission element, comprising an electron emitter including an electron emission region disposed between a gate electrode and a cathode electrode. An anode is disposed above the electron emission region, and a voltage set is disposed above the anode. A first voltage applied between the gate electrode and the cathode electrode controls a quantity of electrons generated from the electron emission region. A second voltage applied to the anode extracts generated electrons. A third voltage applied to the voltage set controls a direction of electrons extracted through the anode.

19 Claims, 5 Drawing Sheets ns with Charge and
ION IMPLANTATION WITH CHARGE AND DIRECTION CONTROL

TECHNICAL FIELD

The present disclosure relates generally to ion implantation, and more particularly, to apparatus and methods for controlling charge and direction of electron emission from an implanter.

BACKGROUND

Ion implantation and doping processes are common in the semiconductor processing industry. However, several disadvantages in conventional ion implantation has been noted. For example, ion beam blowup (i.e., positive ion repulsion from one another) is more significant as the beam becomes narrower (e.g., in 450 mm range), and implant charge accumulated on a substrate (e.g., photoresist or oxide) will influence incident angle of ions, causing an implant loading effect and non-uniform wafer charging distribution. Thus, improved systems, apparatus, and methods of ion implantation are desirable.

SUMMARY

The present disclosure provides for various advantageous methods and apparatus of controlling electron emission. One of the broader forms of the present disclosure involves an electron emission element, comprising an electron emitter including an electron emission region disposed between a gate electrode and a cathode electrode. An anode is disposed above the electron emission region, and a voltage set is disposed above the anode. A first voltage applied between the gate electrode and the cathode electrode controls a quantity of electrons generated from the electron emission region. A second voltage applied to the anode extracts generated electrons. A third voltage applied to the voltage set controls a direction of electrons extracted through the anode.

Another of the broader forms of the present disclosure involves an electron emission system, comprising a top array of electron emission modules and a bottom array of electron emission modules, each electron emission module including an array of electron emission elements, each electron emission element including components as described above. The system further includes an ion beam source configured to direct a positive ion beam between the top array of electron emission modules and the bottom array of electron emission modules.

Yet another of the broader forms of the present disclosure involves a method of controlling electron emission, the method comprising applying a first voltage between a gate electrode and a cathode electrode to control a quantity of electrons generated from an electron emission region disposed between the gate electrode and the cathode electrode, applying a second voltage to an anode disposed above the electron emission region to extract generated electrons, and applying a third voltage to a voltage set disposed above the anode to control a direction of electrons extracted through the anode.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
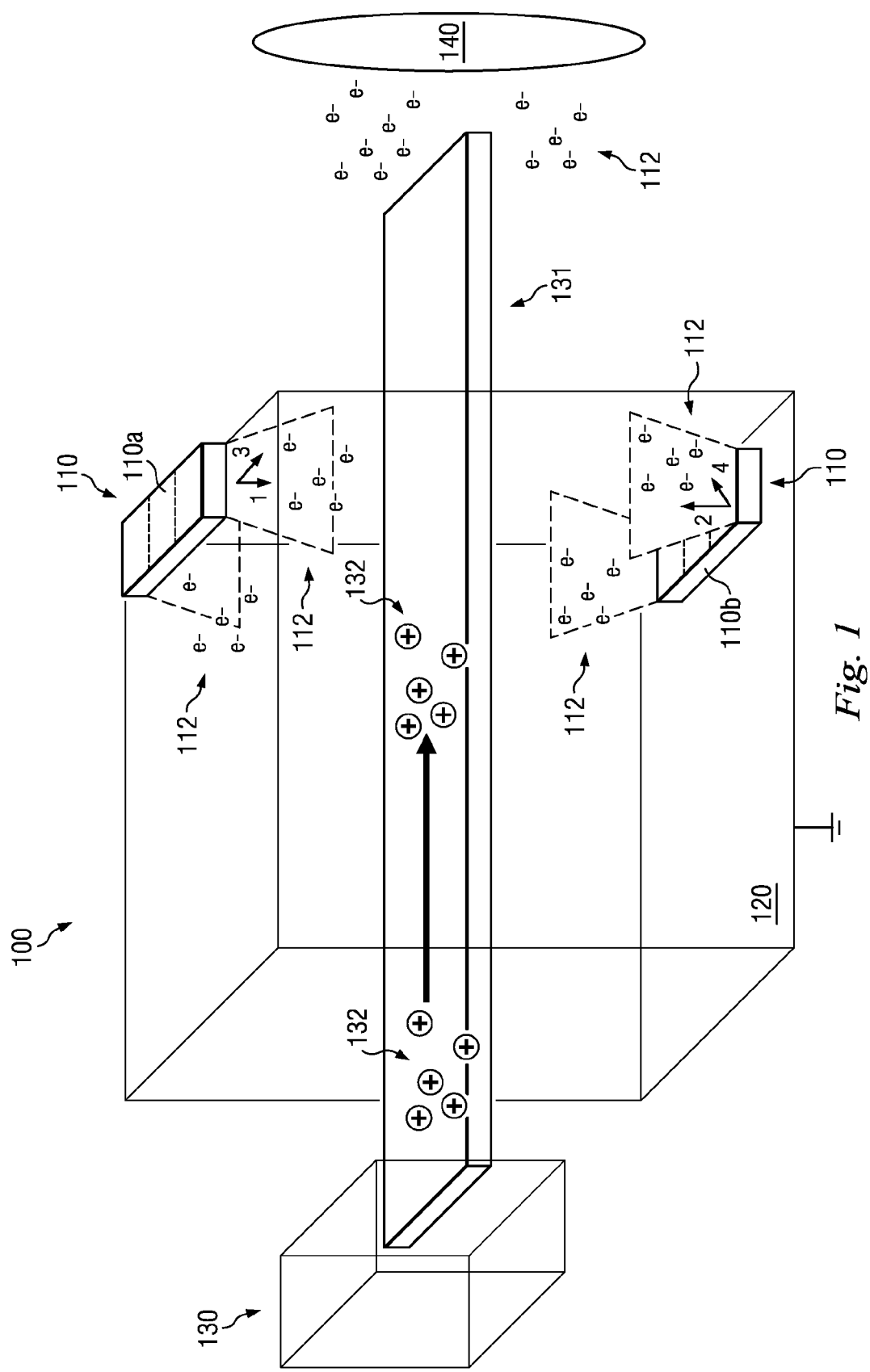
FIG. 1 illustrates an electron emission system in accordance with various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top", may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper", depending on the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first", "second", "third", and so on, may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Figure 2:
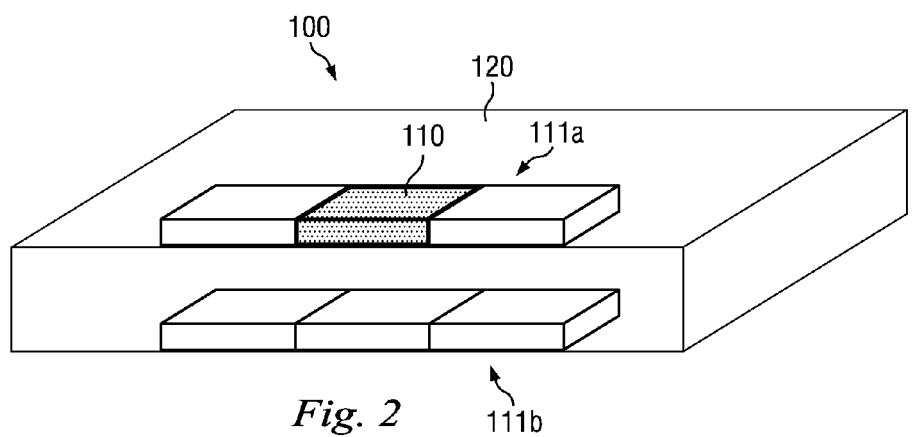
FIG. 2 illustrates arrays of electron emission modules of an electron emission system in accordance with various aspects of the present disclosure.
Figure 3:
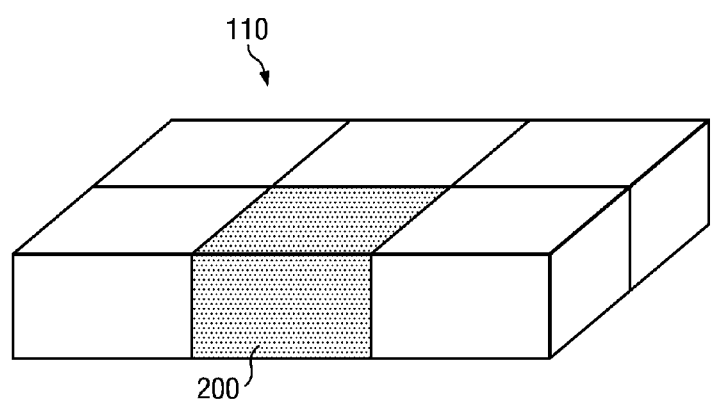
FIG. 3 illustrates an array of electron emission elements of an electron emission module in accordance with various aspects of the present disclosure.

Referring now to FIGS. 1-3, FIG. 1 illustrates an electron emission system 100 in accordance with various aspects of the present disclosure, FIG. 2 illustrates top and bottom arrays 111a and 101b of electron emission modules 110 of electron emission system 100 in accordance with various aspects of the present disclosure, and FIG. 3 illustrates an array of electron emission elements 200 of an electron emission module 110 in accordance with various aspects of the present disclosure.

In accordance with one embodiment, system 100 includes an array of electron emission modules 110 for generating electrons, a chamber 120 for capturing generated electrons, and an ion beam source 130 configured to direct a positive ion beam through chamber 120 to direct generated electrons toward a wafer to be implanted.

In one example, system 100 includes a top array 111a of electron emission modules 110a and a bottom array 111b of electron emission modules 110b disposed on the top and bottom of chamber 120, respectively. Each electron emission module 110 includes an array of electron emission elements 200 as will be further described below, for emitting electrons 112 with controlled quantity or charge and direction. Ion beam source 130 directs ion beam 131 including positive ions 132 through chamber 120 to move generated electrons 112 toward a wafer 140 to be implanted. As shown in FIG. 1, top electron emission modules 110a direct or emit electrons downward toward the ion beam 131 (as shown by arrow 1) and bottom electron emission modules 110b direct or emit electrons upward toward the ion beam 131 (as shown by arrow 2). In a further example, the top and bottom electron emission modules 110a, 110b may also direct or emit electrons toward wafer 140 (as shown by arrows 3 and 4, respectively). Thus, according to one aspect, the top and bottom electron emission modules 110a, 110b may direct or emit electrons toward the ion beam 131 and/or the wafer 140.

In one example, wafer 140 may be mounted on various wafer holder assemblies. In one example, wafer 140 may include various substrates, such as a semiconductor substrate which may be comprised of silicon, or alternatively may include silicon germanium, gallium arsenic, or other suitable semiconductor materials. The wafer substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

Chamber 120 may include various applicable chambers, such as a PFG cage in one example, and chamber 120 may be grounded in another example.

Ion beam source 130 may include various applicable ion beam sources, such as liquid-metal or gas discharge ion sources or focused ion beam systems in one example. According to one aspect, ion beam source 130 may direct ion beam 131 through chamber 120 and toward wafer 140. Ion beam 131 may be directed through chamber 120 and toward wafer 140 at one of various angles.

It is noted according to one aspect, system 100 may be disposed inline with other apparatus of a semiconductor processing flow, or system 100 may be an offline system used for offline processing.

Although the present disclosure is described using a simplified implanting system, those skilled in the art will appreciate that other implanter apparatuses are equally suitable to achieve the desired processing results.

Advantageously, electron emission modules 110 provide electrons by field emission and emit electrons with controllable energy and injection direction to neutralize the ion beam and reduce wafer charging according to one aspect. Thus, the implantation system of the present disclosure can control wafer charging levels and uniformity, reduce a charging-induced implant loading effect, mitigate ion beam blowup, improve implant uniformity, and does not require an inert gas to create hot electrons.

Figure 4A:
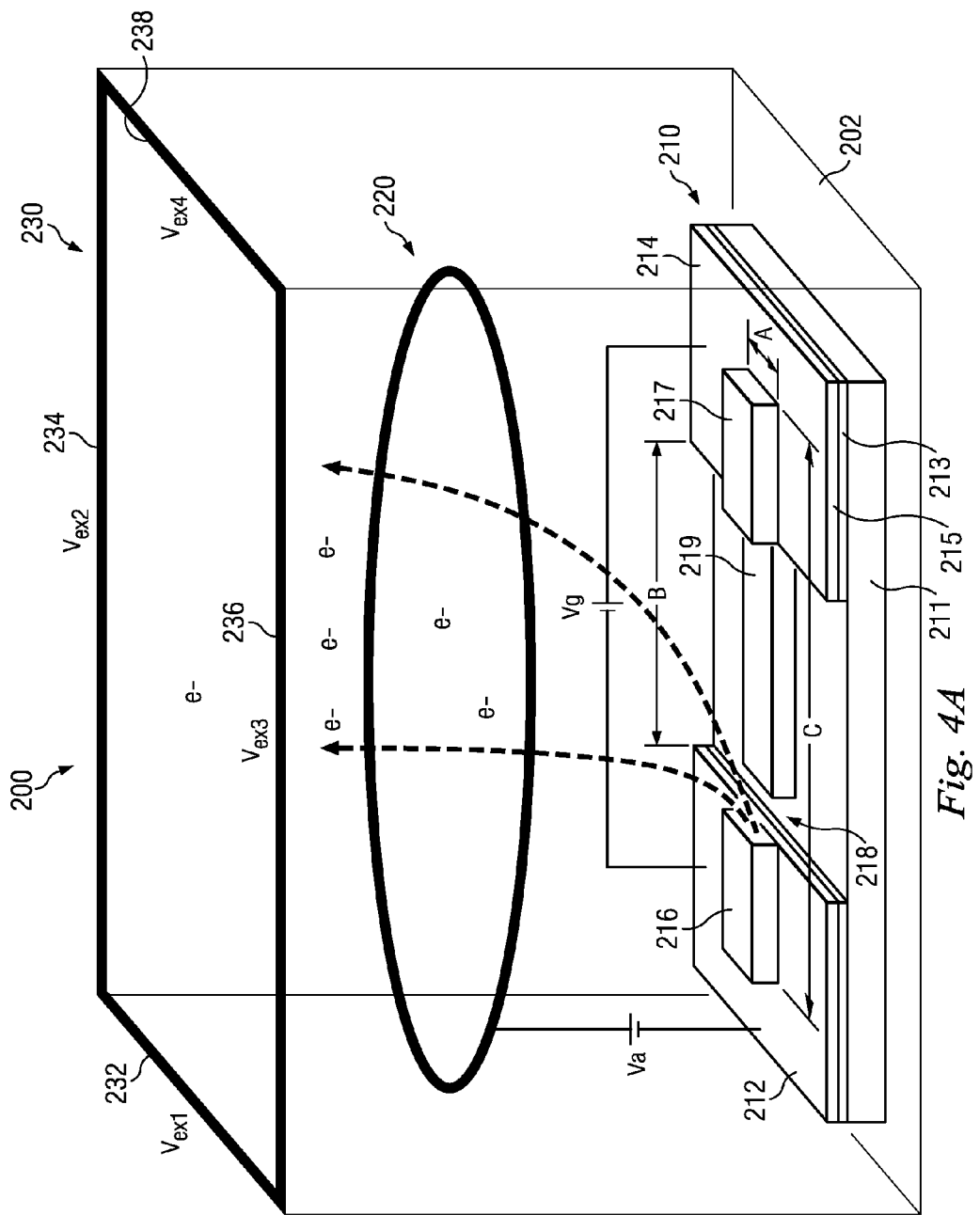
FIGS. 4A and 4B illustrate a perspective view and a cross-sectional view of an electron emission element in accordance with various aspects of the present disclosure.
Figure 4B:
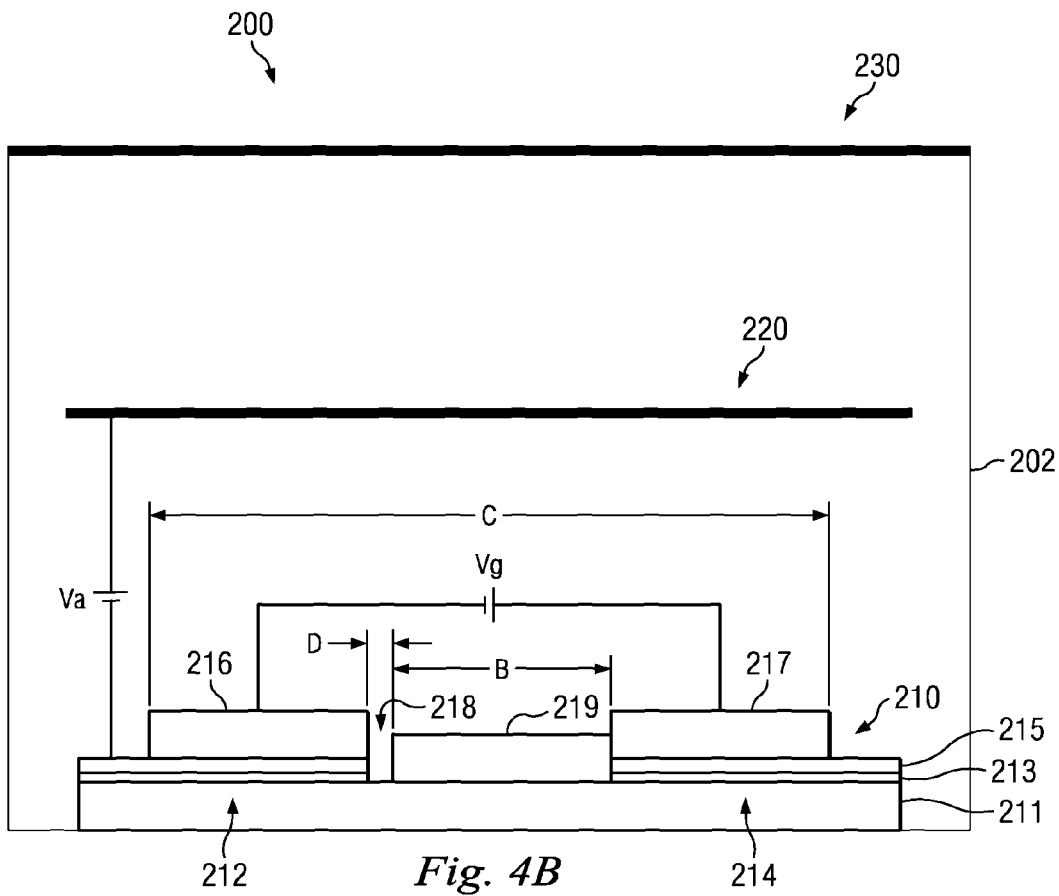

Referring now to FIGS. 4A and 4B, a perspective view and a cross-sectional view of an electron emission element 200 are illustrated, respectively, in accordance with various aspects of the present disclosure. In one embodiment, electron emission element 200 includes a housing 202 housing an electron emitter 210 having an electron emission region 218 for generating electrons. An anode ring 220 is disposed above the electron emission region 218 for extracting generated electrons, and a voltage set 230 is disposed above the anode ring 220 for controlling the direction of electrons extracted through anode ring 220 and emitted from the electron emission element 200.

According to one embodiment, electron emitter 210 includes a dielectric layer 211, such as a silicon oxide layer, two electrodes 212, 214 spaced apart from one another by a distance B and disposed over the dielectric layer 211, and an electrode strip (strips 216, 217, 219) disposed over the two electrodes 212, 214 and the dielectric layer 211, with the electrode strip having a length C and a width A. The electrode strip forms a cathode electrode 216, a gate electrode 217, and electron emission region (e.g., a nanogap 218) disposed between the cathode electrode 216 and the gate electrode 217, and in particular between the cathode electrode 216 and electrode strip 219. Nanogap 218 may have a width D in one example. In a further example, distance A may range between about 1 µm and about 1 mm, distance B may range between about 1 µm and about 100 µm, distance C may range between about 50 µm and about 500 µm, and distance D may range between about 10 nm and about 50 nm.

According to an aspect, each of the two electrodes 212, 214 may be comprised of a titanium layer (e.g., layer 213) and a platinum layer (e.g., layer 215), the electrode strip 216, 217, 219 may be a palladium electrode disposed over the two electrodes and a silicon oxide layer, with the palladium electrode forming the cathode electrode 216, the gate electrode 217, and the nanogap 218 disposed between the cathode electrode 216 and the gate electrode 217.

According to an aspect, voltage set 230 includes a plurality of conductive lines (e.g., lines 232, 234, 236, 238) coupled together into a geometric form, with each conductive line configured to allow for application of a different voltage (e.g., Vex). In one example, voltage set 230 may include four conductive lines 232, 234, 236, 238 coupled together into a rectangular form, with each conductive line 232, 234, 236, 238 configured to allow for application of a voltage Vex1, Vex2, Vex3, and Vex4, respectively.

According to one aspect, a first voltage Vg applied between the cathode electrode 216 and the gate electrode 217 controls a quantity of electrons generated from the electron emission region or nanogap 218. According to another aspect, a second voltage Va applied between the anode ring 220 and cathode electrode 216 extracts the generated electrons from emitter 210. According to yet another aspect, a third voltage (e.g., controlling Vex1, Vex2, Vex3, and Vex4) applied to the voltage set 230 controls a direction of electrons extracted through the anode ring 220 and emitted from the system. According to a further aspect, the first voltage Vg between the gate electrode and the cathode electrode builds a high electric field for electron generation by field emission. The third voltage may be applied to the voltage set 230 to direct electrons (1) toward an ion beam and/or (2) toward a wafer substrate.

In one example, the first voltage Vg may range between about 10V and about 500V, and the second voltage Va may be a positive voltage ranging between about 0.5KV and about 5KV. In another example, the third voltage applied to the voltage set 230 may include a plurality of voltages (e.g., Vex1, Vex2, Vex3, and Vex4) applied to different portions of the voltage set 230. In yet another example, Vex1 may range between about −50V and about 50V, Vex2 may range between about −50V and about 50V, Vex3 may range between about −50V and about 50V, and Vex4 may range between about −50V and about 50V. One or more power supplies, as further described below, may provide the first, second, and third voltages as described above.

Figure 5:
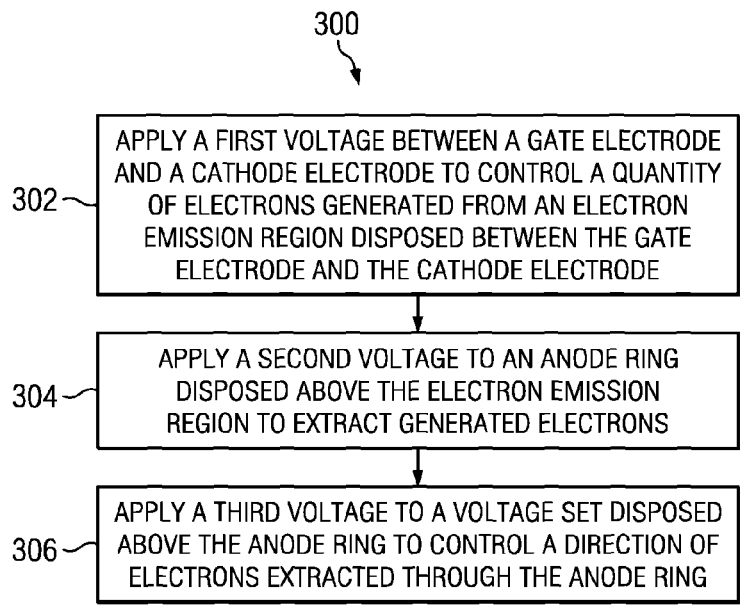
FIG. 5 is a flowchart illustrating a method of controlling electron emission in accordance with various aspects of the present disclosure.

Referring now to FIG. 5, a flowchart illustrates a method 300 of controlling electron emission in accordance with various aspects of the present disclosure. Method 300 includes applying a first voltage between a gate electrode and a cathode electrode to control a quantity of electrons generated from an electron emission region disposed between the gate electrode and the cathode electrode at block 302, applying a second voltage to an anode ring disposed above the electron emission region to extract generated electrons at block 304, and applying a third voltage to a voltage set disposed above the anode ring to control a direction of electrons extracted through the anode ring at block 306. The first voltage between the gate electrode and the cathode electrode builds a high electric field for electron generation by field emission. The third voltage may be applied to the voltage set to direct electrons (1) toward an ion beam and/or (2) toward a wafer substrate. The first, second, and third voltages described above may be provided by one or more power supplies.

It is noted that similar features may be similarly numbered herein for the sake of simplicity and clarity. It is further noted that additional processes may be provided before, during, and after the method 300 of FIG. 5, and that some other processes may only be briefly described herein.

For example, according to one aspect, applying the first voltage may include applying a voltage ranging between about 10V and about 500V, and applying the second voltage may include applying a positive voltage ranging between about 0.5KV and about 5KV. According to another aspect, applying the third voltage may include applying a plurality of voltages applied to different portions of the voltage set. According to yet another aspect, applying the third voltage may include applying a plurality of voltages to the voltage set including a plurality of conductive lines coupled together into a geometric form, with each conductive line configured to allow for a different voltage In accordance with an embodiment of the present disclosure, the first, second, and third voltages may be advantageously applied as described above in order to control the quantity and direction of electrons emitted from an electron emission system to substantially neutralize the charging in an ion beam center and reduce wafer charging. Accordingly, ion implantation on a substrate is improved by mitigating ion beam blow-up, improving ion implant uniformity, and reducing a charging induced implant loading effect.

Figure 6:
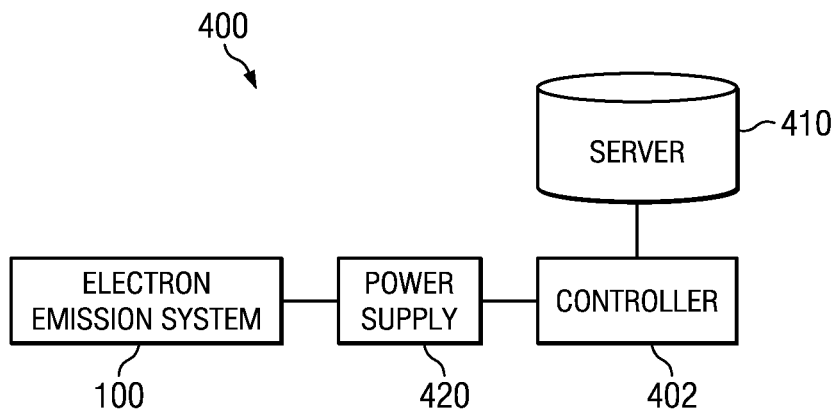
FIG. 6 illustrates a system for controlling electron emission in accordance with various aspects of the present disclosure.

Referring now to FIG. 6, a block diagram illustrates a system 400 for controlling electron emission in accordance with various embodiments of the present disclosure. Controller 402 is operably coupled to power supply 420 and a server 410, and power supply 420 is operably coupled to electron emission system 100 for supplying voltages as described above. In one example, power supply 420 is controlled by software running on controller 402 to apply desired voltages to electron emission system 100 to control the quantity and direction of electrons emitted from the system 100. The software may be downloaded from storage media (e.g. hard drives) of a server 410 by controller 402 in one example. In other embodiments, the software may be located on a hard drive of a personal computer system or downloaded from a removable media (e.g. CD-Rom). The controller 402 executes the software to control the power supply 420, thereby executing one or more of the methods described herein, such as method 300 of FIG. 5. Server 410 may further provide wafer specifications to controller 402.

In one example, power supply 420 may: apply a first voltage between a gate electrode and a cathode electrode to control a quantity of electrons generated from an electron emission region disposed between the gate electrode and the cathode electrode; apply a second voltage to an anode ring disposed above the electron emission region to extract generated electrons; and/or apply a third voltage to a voltage set disposed above the anode ring to control a direction of electrons extracted through the anode ring. Power supply 420 may comprise one or more power supplies adapted to apply different voltages as controlled by controller 402. In one example, power supply 420 may provide multiple and different voltages.

Power supply 420, such as a DC power supply, also may have an output lead electrically connected to the substrate to be implanted, e.g., wafer 140, through one or more slip rings, brushes, or contact pins. Thus, an output lead of power supply 420 may be electrically connected to wafer 140 via a substrate holder assembly or more directly connected for biasing the wafer.

Although the present disclosure is described using a simplified implanting system, those skilled in the art will appreciate that other implanter apparatuses are equally suitable to achieve the desired processing results.

Figure 7:
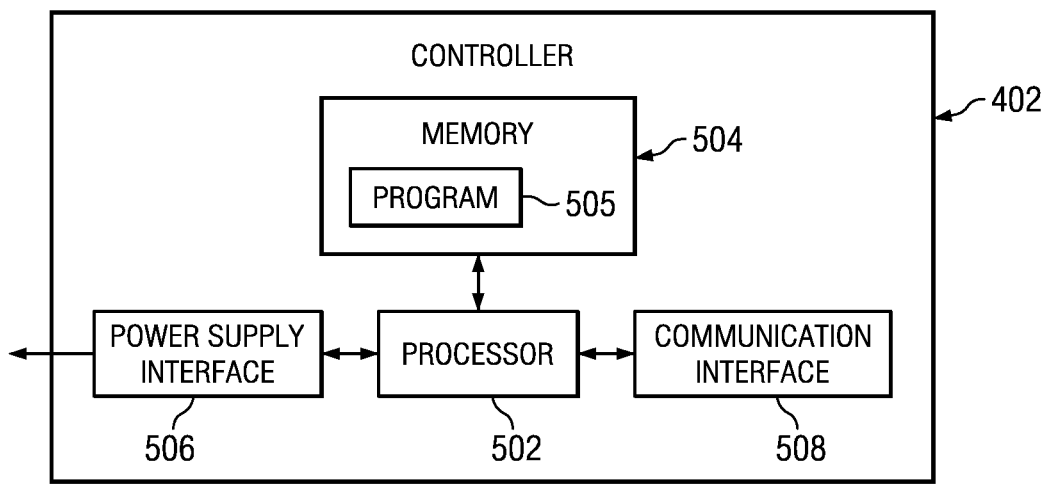
FIG. 7 illustrates a controller in accordance with various aspects of the present disclosure.

FIG. 7 is a block diagram of controller 402 of system 400 of FIG. 6 in accordance with various embodiments of the present disclosure. The controller 402 includes a processor 502, a memory 504, a power supply interface 506, and a communication interface 508. The memory 504 is accessible to the processor 502. In addition, the power supply interface 506 and the communication interface 508 are connected to the processor 502.

The processor 502 can be a microprocessor, controller, or other processor capable of executing a series of instructions. In various embodiments, processor 502 may comprise any type of a processor or a logic device (e.g., a programmable logic device (PLD) configured to perform processing functions). Processor 502 may be adapted to interface and communicate with power supply 420 and/or server 410 (e.g., via power supply interface 506 and/or communication interface 508) to perform method and processing steps and/or operations, as described herein, such as to control and/or adjust first, second, and third voltages as described above, control biasing and other functions (e.g., values for elements such as variable resistors and current sources, switch settings for timing such as for switched capacitor filters, ramp voltage values, or other settings), along with conventional system processing functions as would be understood by one skilled in the art.

Memory 504 comprises, in one embodiment, one or more memory devices adapted to store data and information, including for example wafer electrical properties and information. Memory 504 may comprise one or more various types of memory devices including volatile and non-volatile memory devices, and/or a machine-readable medium capable of storing data in a machine-readable format. Processor 502 may be adapted to execute software stored in memory 504 so as to perform method and process steps and/or operations described herein.

In one example, the memory 504 is a computer readable medium such as random access memory (RAM), non-volatile memory such as flash memory or a hard drive, and the like. Memory 504 may further include a machine-readable medium capable of storing data in a machine-readable format. The memory 504 stores a program 505 including a set of instructions to manipulate the processor 502 to perform one or more of the methods disclosed herein. For example, the program 505 can manipulate the processor 502 to control the power supply interface 506. Via the power supply interface 506, the processor 502 controls the power supply 420 to provide first, second, third, and other voltages, as described herein. Controller 402 may further include a communication interface to access server 410, which may provide wafer specifications to controller 402 or processor 502 for providing wafer properties. In other embodiments, wafer specifications may be received in memory 504 or inputted into memory 504 by a user to provide wafer specifications to processor 502.

Accordingly, in various embodiments of the present disclosure, processor 502 is configured to control the power supply 420 in order to apply a first voltage between a gate electrode and a cathode electrode to control a quantity of electrons generated from an electron emission region disposed between the gate electrode and the cathode electrode, apply a second voltage to an anode ring disposed above the electron emission region to extract generated electrons, and/or apply a third voltage to a voltage set disposed above the anode ring to control a direction of electrons extracted through the anode ring.

Controller 402 may further include other components although not illustrated in the figures, such as a user interface in one example. The user interface may include a user input and/or interface device. For example, the user input and/or interface device may represent a rotatable knob (e.g., potentiometer), push buttons, slide bar, keyboard, or other device, that is adapted to generate a user input control signal. The processor may be adapted to sense control input signals from the user interface and respond to any sensed control input signals received therefrom. The processor may be adapted to interpret such a control input signal as a parameter value, as generally understood by one skilled in the art.

Controller 402 may perform the methods described above and below by a combination of hardware, firmware, and/or software utilizing memory 504, processor 502, and/or other components as necessary. It will be appreciated that other types of systems can be used in other embodiments to execute one or more of the methods described herein.

The present disclosure provides for various advantageous methods and apparatus of controlling electron emission. One of the broader forms of the present disclosure involves an electron emission element, comprising an electron emitter including an electron emission region disposed between a gate electrode and a cathode electrode, an anode disposed above the electron emission region, and a voltage set disposed above the anode. A first voltage applied between the gate electrode and the cathode electrode controls a quantity of electrons generated from the electron emission region. A second voltage applied to the anode extracts generated electrons. A third voltage applied to the voltage set controls a direction of electrons extracted through the anode.

Another of the broader forms of the present disclosure involves an electron emission system, comprising a top array of electron emission modules and a bottom array of electron emission modules, each electron emission module including an array of electron emission elements, each electron emission element including components as described above. The system further includes an ion beam source configured to direct a positive ion beam between the top array of electron emission modules and the bottom array of electron emission modules.

Yet another of the broader forms of the present disclosure involves a method of controlling electron emission, the method comprising applying a first voltage between a gate electrode and a cathode electrode to control a quantity of electrons generated from an electron emission region disposed between the gate electrode and the cathode electrode, applying a second voltage to an anode disposed above the electron emission region to extract generated electrons, and applying a third voltage to a voltage set disposed above the anode to control a direction of electrons extracted through the anode.

Advantageously, the present disclosure allows for the control of the quantity and direction of electrons in ion implantation. Thus, the ion beam may be neutralized and wafer charging may be reduced to thereby mitigate ion beam blow-up, improve ion implant uniformity, and reduce a charging induced implant loading effect. The present implanter and implantation method does not require the use of an inert gas, thus simplifying implant processing.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An electron emission element, comprising:
   an electron emitter including an electron emission region disposed between a gate electrode and a cathode electrode;
   an anode including a conductive ring enclosing a central region, wherein the anode is disposed above the electron emission region such that electrons generated from the electron emission region are directed through the central region of the anode; and
   a voltage set including a conductive loop enclosing a central region, wherein the voltage set is disposed above the anode such that the generated electrons are directed towards the central region of the voltage set,
   wherein a first voltage applied between the gate electrode and the cathode electrode controls a quantity of the electrons generated from the electron emission region,
   wherein a second voltage applied to the conductive ring extracts the generated electrons,
   wherein a third voltage applied to the conductive loop controls a direction of the electrons extracted through the anode, and
   wherein the first voltage ranges between 10V and 500V.

2. The electron emission element of claim 1, wherein the electron emitter further includes:
   a silicon oxide layer;
   two electrodes spaced apart from one another and disposed over the silicon oxide layer, each of the two electrodes comprised of titanium and platinum; and
   a palladium electrode disposed over the two electrodes and the silicon oxide layer, the palladium electrode forming the gate electrode, the cathode electrode, and a nanogap between the cathode electrode and the gate electrode.

3. The electron emission element of claim 1, wherein the electron emission region includes a nanogap.

4. The electron emission element of claim 1, wherein the second voltage is a positive voltage ranging between 0.5 KV and 5 KV.

5. The electron emission element of claim 1, wherein the third voltage includes a plurality of voltages applied to different portions of the voltage set.

6. The electron emission element of claim 1, wherein the conductive loop includes a plurality of conductive lines coupled together into a geometric form, each conductive line configured to allow for application of a different voltage.

7. An electron emission system, comprising:
   a top array of electron emission modules and a bottom array of electron emission modules, each electron emission module including an array of electron emission elements, each electron emission element including:
      an electron emitter including an electron emission region disposed between a gate electrode and a cathode electrode;
      an anode disposed above the electron emission region; and
      a voltage set disposed above the anode,
      wherein a first voltage applied between the gate electrode and the cathode electrode controls a quantity of electrons generated from the electron emission region,
      wherein a second voltage applied to the anode extracts generated electrons, and
      wherein a third voltage applied to the voltage set controls a direction of electrons extracted through the anode; and
   an ion beam source configured to direct a positive ion beam between the top array of electron emission modules and the bottom array of electron emission modules.

8. The system of claim 7, wherein the electron emitter further includes:
   a silicon oxide layer;
   two electrodes spaced apart from one another and disposed over the silicon oxide layer, each of the two electrodes comprised of titanium and platinum; and
   a palladium electrode disposed over the two electrodes and the silicon oxide layer, the palladium electrode forming the gate electrode, the cathode electrode, and a nanogap between the cathode electrode and the gate electrode.

9. The system of claim 7, wherein the electron emission region includes a nanogap.

10. The system of claim 7, wherein the first voltage ranges between 10V and 500V.

11. The system of claim 7, wherein the second voltage is a positive voltage ranging between 0.5 KV and 5 KV.

12. The system of claim 7, wherein the third voltage includes a plurality of voltages applied to different portions of the voltage set.

13. The system of claim 7, wherein the voltage set includes a plurality of conductive lines coupled together into a geometric form, each conductive line configured to allow for application of a different voltage.

14. A method of controlling electron emission, the method comprising:

applying a first voltage between a gate electrode and a cathode electrode to control a quantity of electrons generated from an electron emission region disposed between the gate electrode and the cathode electrode;

applying a second voltage to an anode disposed above the electron emission region to extract generated electrons; and applying a third voltage to a voltage set disposed above the anode to control a direction of electrons extracted through the anode.

15. The method of claim 14, wherein the electron emission region includes a nanogap.

16. The method of claim 14, wherein applying the first voltage includes applying a voltage ranging between 10V and 500V.

17. The method of claim 14, wherein applying the second voltage includes applying a positive voltage ranging between 0.5 KV and 5 KV.

18. The method of claim 14, wherein applying the third voltage includes applying a plurality of voltages applied to different portions of the voltage set.

19. The method of claim 14, wherein applying the third voltage includes applying a plurality of voltages to the voltage set including a plurality of conductive lines coupled together into a geometric form, each conductive line configured to allow for a different voltage.

* * * * *